United States Patent [19]

Kitajima

[11] Patent Number: 5,309,010
[45] Date of Patent: May 3, 1994

[54] SEMICONDUCTOR DEVICE HAVING IMPROVED THIN FILM TRANSISTORS

[75] Inventor: Hiroshi Kitajima, Tokyo, Japan
[73] Assignee: NEC Corporation, Tokyo, Japan
[21] Appl. No.: 888,806
[22] Filed: May 27, 1992
[30] Foreign Application Priority Data

May 27, 1991 [JP] Japan .................. 3-120597

[51] Int. Cl.⁵ .................. H01L 27/01; H01L 27/12; H01L 31/0392; H01L 27/11
[52] U.S. Cl. .................. 257/347; 257/350; 257/351; 257/369; 257/904
[58] Field of Search .............. 257/347, 348, 349, 350, 257/351, 352, 353, 354, 369, 377, 401, 69, 903, 904

[56] References Cited

U.S. PATENT DOCUMENTS

| | | | |
|---|---|---|---|
| 4,484,209 | 11/1984 | Uchida | 257/353 |
| 4,533,934 | 8/1985 | Smith | 257/354 |
| 4,996,574 | 2/1991 | Shirasaki | 257/347 |
| 5,072,286 | 12/1991 | Minami et al. | 257/369 |
| 5,115,289 | 5/1992 | Hisamoto et al. | 257/347 |

FOREIGN PATENT DOCUMENTS

| | | | |
|---|---|---|---|
| 1-27270 | 1/1989 | Japan | 257/347 |
| 2-30147 | 1/1990 | Japan | 257/408 |
| 2222306 | 2/1990 | United Kingdom | 257/347 |

*Primary Examiner*—Rolf Hille
*Assistant Examiner*—Steven Loke
*Attorney, Agent, or Firm*—Sughrue, Mion, Zinn, Macpeak & Seas

[57] ABSTRACT

A semiconductor device comprising a MOS transistor made at the surface of a p-type silicon substrate with a ridge on the surface of it and covered with an insulating film. The gate electrode of the MOS transistor has a configuration of the ridge covered with the insulating film. The semiconductor further comprises a TFT build under the utilization of the ridge. The channel region of the TFT is formed only on the side face(s) of the gate electrode. The source and drain regions extending across the ridge are disposed on the opposite sides of, and connect to, the channel region. Thus the channel region of the TFT is perpendicular to the surface of the silicon substrate, and the channel current flows parallel to the surface of the silicon substrate. The channel width of the TFT is determined substantially by the height of the gate electrode of MOS transistor, and hence becomes narrower than the minimum processible size. This TFT therefore is capable of size reduction. It has further advantages of reduced short channel effect and less leak current particularly when turned off.

8 Claims, 12 Drawing Sheets

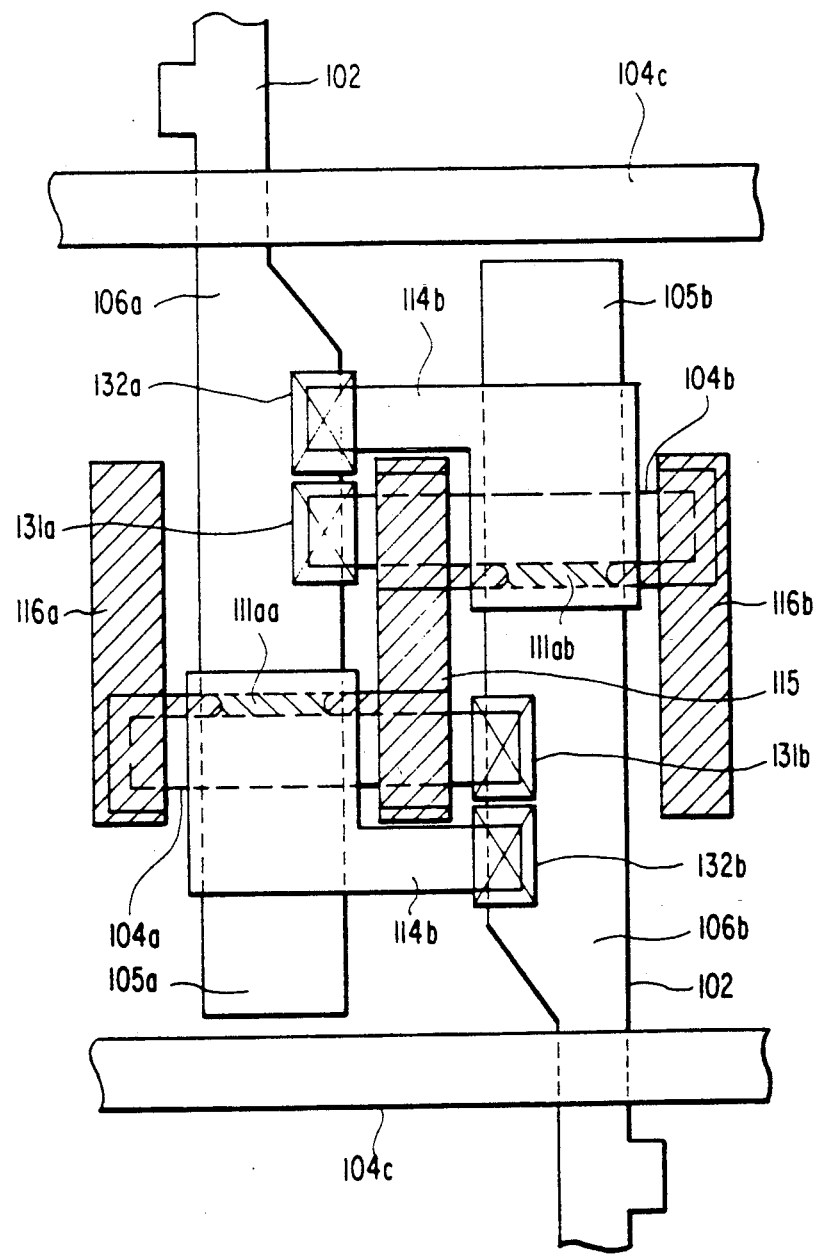

SEMICONDUCTOR DEVICE HAVING IMPROVED THIN FILM TRANSISTORS

BACKGROUND OF THE INVENTION

1. Field of the Invention

This invention relates to a semiconductor device, and more particularly to the structure of a thin film transistor (referred to as TFT hereinafter) as active element for high-density integrated circuits.

2. Description of the Prior Art

A MOS transistor of which channel region is of a semiconductor film formed over a substrate is called thin film transistor (TFT). TFT has being developed, for example, as switching matrix element for driving the liquid crystal display. Further with high-level integration of semiconductor device, TFT been becoming noticed because the overlay of a TFT on a transistor previously made at the surface of the semiconductor substrate enables high-level integration of semiconductor device. In particular, for SRAM, it is being in progress to use p-channel TFT as load element instead of conventional load element of polycrystalline silicon (referred to as polysilicon).

The TFT used in conventional semiconductor device has, for instance, such a structure that an insulating film is formed over the surface of a semiconductor substrate, a gate electrode is formed on the insulating film and coated with a gate-insulating film, a semiconductor film is deposited over the gate insulating film, and then source, drain, and channel regions are formed in the semiconductor film. A TFT like this made in such a way that the gate electrode underlies semiconductor film is called "bottom gate type TFT". On the other hand, a TFT where the gate electrode overlies the semiconductor film is called "top gate type TFT". In many cases the channel region is disposed parallel to the surface of the semiconductor substrate. The width and length of the channel is limited to the minimum processible size.

For the purpose of remitting the above-mentioned defect, for example, a TFT of the structure that the channel region made of a semiconductor film formed on the side face(s) of the gate electrode is reported in the 1984's Symposium on VLSI Technology, Digest of Technical Papers, pp. 8–9. It is of bottom gate type. The semiconductor device provided with the TFT is constructed as follows: At the surface of a p-type silicon substrate is made a n-channel MOS transistor which consists of $n^+$-type source and drain regions formed at the surface of the p-type silicon substrate, the first gate oxide film formed on the p-type silicon substrate, and a gate electrode formed on the first gate oxide film. The gate electrode is formed from $n^+$-type polysilicon.

The TFT is built over the n-channel MOS transistor, and the gate electrode of the latter is used as one common to both transistors. The second gate oxide film formed over the surfaces of the gate electrode, and $n^+$-type source and drain regions also constitutes the gate insulating film of the TFT. Over the second gate oxide film is formed a polysilicon film in which the $p^+$-type source and drain regions and the channel region of the TFT are formed by ion implantation of p-type impurity perpendicular to the silicon substrate. The channel region is formed on the opposite surface of the second gate oxide film to the side face of the gate electrode. The $p^+$-type source region is formed on the opposite surface of the second gate oxide film to the $n^+$-type source and drain regions. The $p^+$-type drain region is formed on the opposite surface of the second gate oxide film to the gate electrode. The surface of the channel region of the TFT is covered with a silicon oxide film used for side wall, and the remaining surface with silicon oxide film.

In this TFT, channel current flows perpendicularly to the surface of the silicon substrate. The channel length of the TFT depends substantially on the height (film thickness) of the gate electrode, and hence is possible to be smaller than the minimum processible size. The TFT therefore is capable of further size reduction. In the TFT of such structure however, though the channel length is short, the interface between the drain and channel regions is on the second gate oxide film because they are formed on the film. This reflects a great electric field at the drain region end which may be a cause of lowering the characteristics, for example, increasing in leak current.

A proposition for remitting this defect is made in Japanese Patent Laid-Open Application No. Hei. 2-30147. Over a silicon substrate is formed the first insulating film on which a TFT is made. The gate electrode of this TFT is made from polysilicon and formed on the first insulating film. A gate insulating film is formed on the side face of the gate electrode of the TFT, and the second insulating film as sufficiently thick as about 200 nm on the top. Besides a polysilicon film is formed to cover the gate insulating film and the first and second insulating films, and then subjected to ion implantation of p-type impurity perpendicularly to the silicon substrate, in the same way as in the aforesaid report, to form $p^+$-type source and drain regions, and channel region of the TFT. In the thus-obtained TFT, the $p^+$-type drain region is of offset structure with respect to the gate electrode because of the presence of the second insulating film, which brings a reduced electric field at the end of the $p^+$-type drain. This TFT therefore can contribute to improvement in characteristics over the TFT of the aforesaid report.

As an example of applying the TFT described in the aforesaid patent application to a high density integrated circuit, a p-type load element for SRAM is given below. The TFT in which polysilicon film is used as semiconductor film as described above, because of the channel region of polysilicon, is inferior in characteristics to the MOS transistor built at the surface of the single crystal silicon. Since polysilicon has a greater diffusion constant of impurity than single crystal silicon, characteristics of the TFT are poor if it is built to have a short channel length. For building p-channel TFT, ion implantation of B or $BF_2$ is carried out to form source and drain regions. In this case if ion implantations for source and drain regions are carried out at a distance (referred to as implantation distance hereinafter) of up to 0.8 $\mu$m, the off-current of the TFT increases because of the short channel effect. When the end part of the drain region is not of offset structure with respect to the gate electrode, the relationship of off-leak current per channel width to implantation distance along the channel are, assuming drain voltage = $-3.3$ V, 1 pA/$\mu$m, to 0.8 $\mu$m, and 10 to 100 pA/um to 0.7 $\mu$m. Further 0.1 $\mu$m shorter implantation distance causes two or more figures greater off-leak current. In brief, the implantation distances of up to 0.8 $\mu$m has little offset-structure effect on off-leak current, and the turn-off will not be caused even at 0 V of gate voltage. On the other hand, at longer implantation distances the short channel effect becomes less, resulting in decrease of off-leak current. Off-leak current therefore tends to be smaller in the TFT having a drain region of off-set structure. Accordingly the TFT described in the aforesaid patent specification is considered to be little practical advantage as far as the actual characteristics are not remarkably improved. It can not meet strict requirement for off-leak current, which the p-type load element of SRAM makes.

Besides in the case, for example, of SRAM, where high-speed operation is required, for example, parasitic capacity is necessary to be as small as possible. In the TFT of the aforesaid report, the coupling capacities between $n^+$-type source and drain regions and $p^+$-type source region, and coupling capacity between the $p^+$-type drain region and the gate electrode are so great as to stand in the way of high-speed operation. In addition in the TFT described in the aforesaid patent specification, the gate electrode of it is used also as the gate electrode of the n-channel drive transistor in the SRAM, and not the first insulating film but the gate insulating film of the drive transistor is formed just beneath the $p^+$-type source region of the TFT, and in turn beneath it the source or drain region of the drive transistor is formed, so that the coupling capacity between these and the $p^+$-type source region of the TFT is great and stands in the way of high speed operation.

BRIEF SUMMARY OF THE INVENTION

Objects of the Invention

It is an object of the invention to provide a semiconductor device with a TFT capable of size reduction.

Another object of the invention is to provide a semiconductor device with a less-leak-current TFT capable of size reduction.

A further object of the invention is to provide a less-leak-current TFT capable of size reduction and suitable for high-speed operation.

A further object of the invention is to provide a semiconductor device with a TFT of which the channel region is narrow in channel width and perpendicular to the surface of the semiconductor substrate, wherein the channel current flows parallel to the surface of the surface of the semiconductor substrate.

A further object of the invention is to provide a SRAM having a p-channel TFT as load element.

A further object of the invention is to provide a SRAM having as load element, a p-channel TFT capable of size reduction.

A further object of the invention is to provide a SRAM having as load element a less-leak-current p-channel TFT capable of size reduction.

A further object of the invention is to provide a SRAM having as load element a less-leak-current p-channel TFT capable of size reduction and suitable for high speed operation.

SUMMARY OF THE INVENTION

A semiconductor device according to the present invention comprises an insulating film formed over a semiconductor substrate with a ridge; a semiconductor thin film consisting of a first area formed on the insulating film and extending across a longitudinal part of the ridge, a second area formed on the insulating film and extending across another longitudinal part of the ridge distant from the first area, and a third area formed on the insulating film and extending alongside at least one side face of the ridge to interconnect between the first and second areas; and a TFT comprising the first, second, and third areas as the source, drain, and channel regions, respectively.

In a preferable embodiment, the semiconductor substrate is a silicon substrate; and the ridge is the gate electrode of a MOS transistor formed at the surface of the silicon substrate.

In another preferable embodiment, the TFT comprises a gate insulating film formed over the semiconductor film, and a gate electrode formed on the gate insulating film.

In a further embodiment, the gate electrode of the MOS transistor is common gate electrode used also as the gate electrode of the TFT; and the insulating film between the third area of the semiconductor film and the gate electrode of the MOS transistor serves also as the gate insulating film of the TFT.

In a further preferable embodiment, the semiconductor device is a SRAM; the silicon substrate is a p-type silicon substrate; the MOS transistor is a drive transistor consisting of a n-channel MOS transistor; the semiconductor film is of polysilicon; and the TFT is a load element consisting of p-channel TFT.

The semiconductor device according to the invention has a TFT built on an insulating film over the surface of a semiconductor substrate having thereon a ridge, the channel region of the TFT being formed only on the opposite surface area(s) of the insulating film to the side face of the ridge. Thus the channel region is perpendicular to, and the channel current of the TFT flows parallel, to the surface of the semiconductor substrate. The channel width of the TFT is determined by the height of the ridge. Therefore a TFT narrower than the minimum processible size is obtained, and thereby the TFT is readily capable of size reduction without shortening the channel length.

Besides in the cases of using such a TFT as load element of SRAM, it is easy, because of the reduced short channel effect of the TFT, to decrease off-leak current. In addition, to form the source and drain regions of the TFT just over the source and drain regions of the n-channel MOS built at the semiconductor substrate is avoidable, and this enables to reduce parasitic capacity of the source and drain regions of the TFT, and also facilitates to obtain a semiconductor device capable of high speed operation.

BRIEF DESCRIPTION OF THE DRAWINGS

The above-mentioned and other objects, features and advantages of this invention will become more apparent by reference to the following detailed description of the invention taken in conjunction with the accompanying drawings, wherein:

FIG. 9 is schematic plan view of a memory cell of a SRAM to which the second embodiment is applied, in the way of the process of fabricating it;

DETAILED DESCRIPTION OF PREFERRED EMBODIMENTS

Firstly semiconductor devices in the prior art will be set forth with reference to the drawings before describing the present invention.

TFTs as components of conventional semiconductor devices have mostly a channel region disposed parallel to the surface of the semiconductor substrate. In this case both width and length of the channel region are limited to the minimum processible size. For the purpose of improving this, for example, a TFT of such construction that the semiconductor film formed on a side face of the gate electrode is used as the channel region was reported in the 1984's Symposium on VLSI Technology, Digest of Technical Papers, pp. 8–9.

Figure 1:
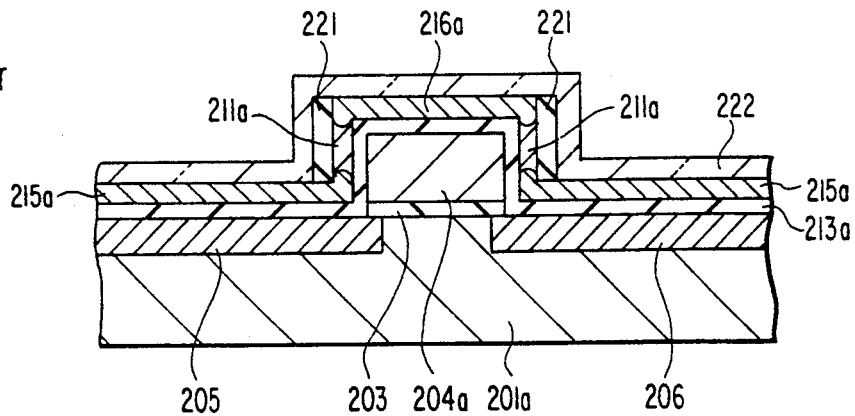
FIG. 1 is a schematic cross-sectional view illustrating a semiconductor device with a TFT of a conventional structure.

This TFT, referring to FIG. 1, schematic cross-section of the semiconductor device, is a bottom gate type TFT constructed as the following: At the surface of a p-type silicon substrate 201a is provided a n-channel MOS transistor consisting of n+-type source and drain regions 205, 206 at p+-type silicon substrate 201a, a first gate oxide film 203 on p-type silicon substrate 201a, and a gate electrode 204a formed on the first gate oxide film 203. This gate electrode 204a is made from n+-polysilicon.

The TFT is built to overlie the n-channel MOS transistor, and the gate electrode 204a is common to both transistors. As the gate-insulating film of the TFT a second gate oxide film 213a is formed which covers the surfaces of the gate electrode 204a, source region 205, and drain region 206. Over the second gate oxide film 213a a thin polysilicon film is formed. Ion implantation of the p-type impurity vertical to silicon substrate 201a is carried out to define p+-type source, drain, and channel regions 215a, 216a, and 211a of the TFT in the polysilicon film. The channel region 211a is formed on the opposite surface of second gate oxide film 213a to the a side face of gate electrode 204a. A p+-type source region 215a is formed on the opposite surface of the second gate oxide film 213a to n+-type source and drain regions 205, 206. A p+-type drain region 216a is formed on the opposite surface of the second gate oxide film 213a to gate electrode 204a. The surface of the channel region 211a of the TFT is covered with a silicon oxide film 221 as side wall. Besides the surface of the TFT is coated with a silicon oxide film 222.

In this TFT, channel current flows perpendicularly to the surface of silicon substrate 201a. In the above-mentioned process, the channel length of the TFT depends substantially on the height (film thickness) of gate electrode 204a, which enables it to be smaller than the minimum processible size, that is, the TFT is capable of size reduction. In the TFT, channel region 211 connects to drain region 216a and hence the electric field at the edge of it on the drain 216a side is great. This may induce lowering in characteristics, for example, increase of leak current.

Figure 2:
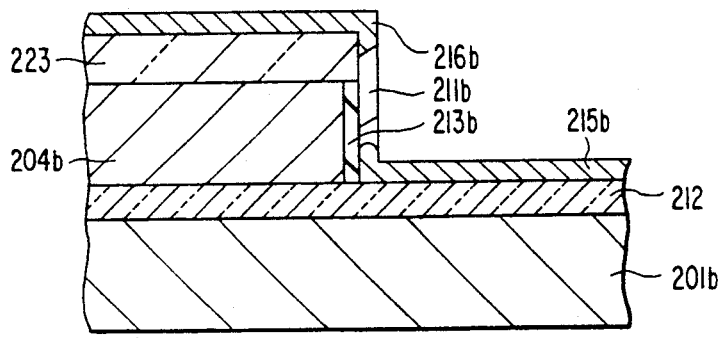
FIG. 2 is a schematic cross-sectional view illustrating a semiconductor device with a TFT of another conventional structure.

A proposition for overcoming the above-mentioned drawback was made in Japanese Patent Laid-Open Application No. Hei. 2-30147. Referring to FIG. 2, a schematic cross-section of the semiconductor device, on a silicon substrate 201b is formed a oxide film 212 over which a TFT is built. The gate electrode 204b of the TFT is made from polysilicon and formed on oxide film 212. There are provided a gate-insulating film 213b of the TFT on a side face of the gate electrode 204b, and an insulating film 223 as sufficiently thick as about 200 nm on the top face thereof. Over these gate insulating films 213b, 223 and oxide film 212, a polysilicon film is formed, into which ion implantation of p-type impurity is made, in the which ion implantation of p-type impurity is made, in the same way as stated in the aforesaid report, perpendicularly to silicon substrate 201b to form p+-type source, drain, and channel regions 215b, 216b, 211b of the TFT. Because of the presence of insulating film 223, drain region 216b is of offset structure to gate electrode 204b, which reflects reduced electric field at the edge of channel region 211b on the side of drain region 216b. It therefore is possible to improve in characteristics over the TFT of the aforesaid report.

The use of this TFT described in the aforesaid patent application as a p-type load element of a SRAM will be considered. For the TFT, polysilicon film is used as semiconductor film, hence the channel region of it being made from polysilicon, and therefore the TFT is inferior in characteristics to MOS transistor built at the surface of a single crystal silicon. Because of the greater diffusion constant of polysilicon than that of single crystal silicon, the TFT of polysilicon, if made to have a short channel length, has poor characteristics. If the p-channel TFT is made by ion implantation at a distance of up to 0.8 μm between source and drain regions, the off-leak current becomes greater due to the short channel effect irrespective of whether or not the drain region is of offset structure with respect to the gate electrode. Thus the TFT described in the above-mentioned patent application is considered to be little practical advantage as far as no great improvement in characteristics is obtained.

In addition the SRAM is involved in high-speed operation, and hence required to have as small unwanted parasitic capacity as possible. In the TFT of the aforesaid report, coupling capacities between source region 215a, and source region 205 and drain region 206, respectively, and between gate electrode 204a and drain region 216a are great, which stands in the way of the high-speed operation. On the other hand, in the TFT described in the aforesaid patent application, gate electrode 204b serves also as the gate electrode of the n-channel drive transistor of the SRAM. Just beneath source region 215b, not an insulating film 212 but the gate insulating film of this drive transistor is formed. Beneath this, in turn, the n+-type source or drain region of the drive transistor is formed, and hence coupling capacities between these and source region 215a are great and stand in the way of high speed operation.

The description of the present invention will be given with reference to the drawings hereinafter.

Figure 3:
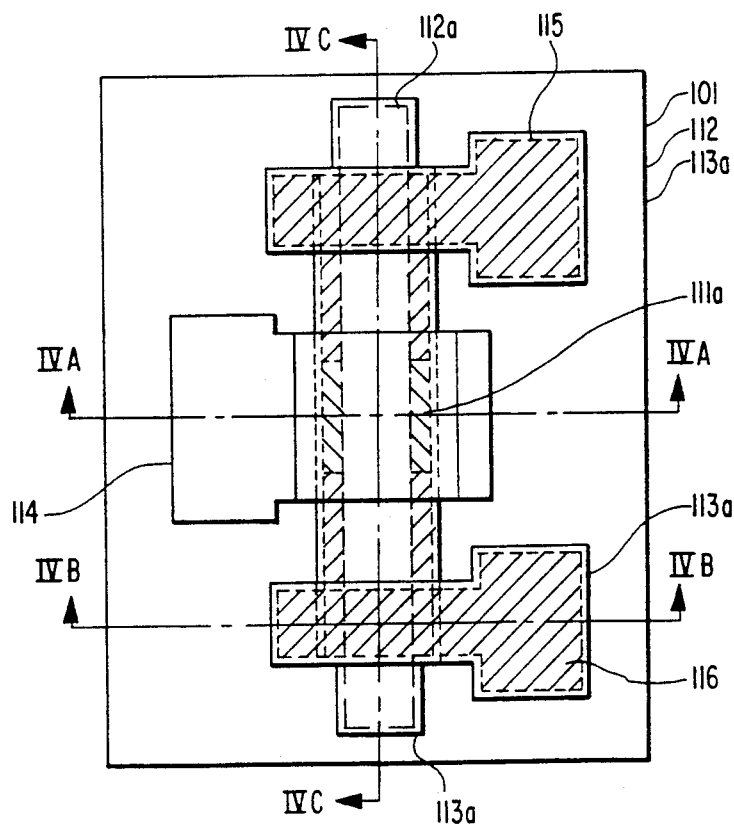
FIG. 3 is a schematic plan view illustrating the first embodiment of the present invention.
Figure 4A:
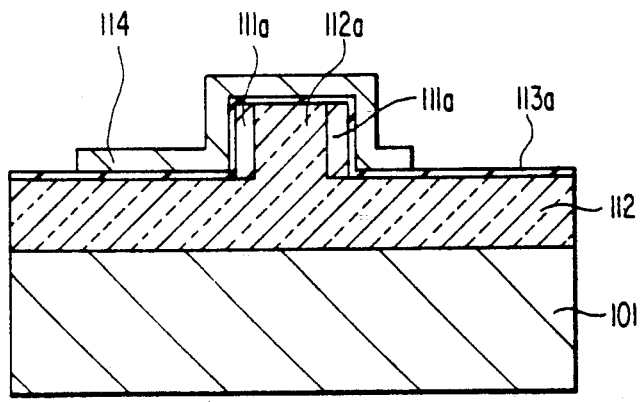
FIGS. 4A through 4C are schematic cross-sectional views taken along lines A—A, B—B, and C—C, respectively, of FIG. 3 for illustrating the first embodiment of the present invention.
Figure 4B:
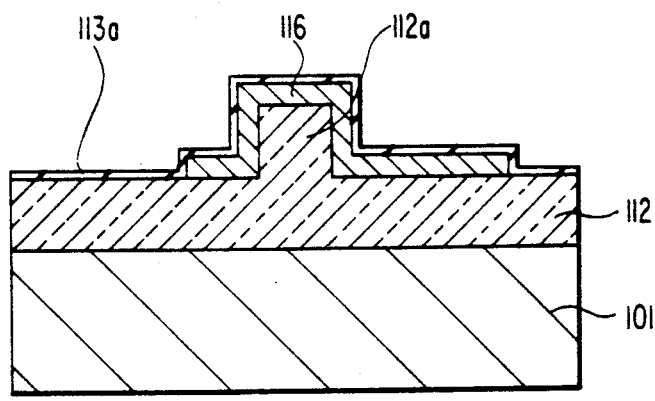
Figure 4C:
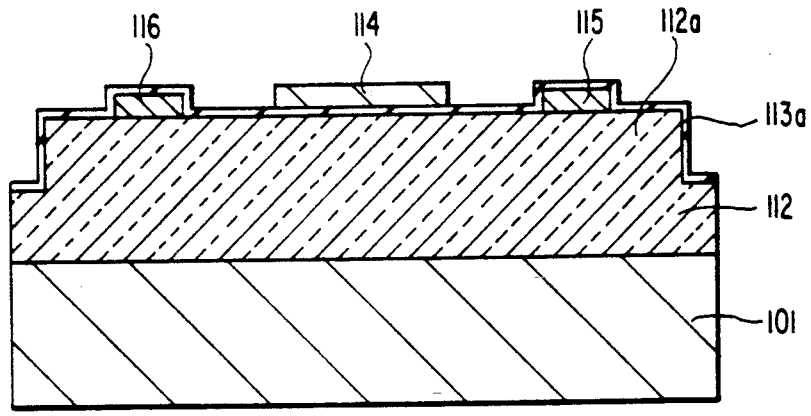

With reference to FIGS. 3, 4A, 4B, and 4C, the first embodiment of the present invention will be set forth below. FIG. 3 is a schematic plan of the semiconductor device of this embodiment, and FIGS. 4A, 4B, and 4C are schematic cross-sections taken along lines A—A, B—B and C—C, respectively, of FIG. 3. The semiconductor device is provided with a p-channel TFT of the structure described in the following. Over the surface of p-type silicon substrate 101 is formed a field oxide film 112 which has on the surface a ridge 112a of about 0.1 μm high. On the field oxide film, the first and second areas of polysilicon each extending across ridge 112a are formed. A third area of n-type polysilicon, about 30 to 50 nm in thickness, extending along a side face of ridge 112a to interconnect between the first and second areas is formed. (The process of forming the polysilicon film will be detailed later.) A gate oxide film 113a is formed over these polysilicon films, ridge 112a, and field oxide film 112 by the chemical vapor deposition technique. Further on the gate oxide film 113a is formed a gate electrode area of polysilicon film extending across the third area of polysilicon film. By ion implantation of B or BF$_2$, the gate electrode area of polysilicon film constitutes a p+-type gate electrode 114 of the TFT, and the first and second areas of polysilicon-film become p+-type source and drain regions 115, 116. Simultaneously the third area of polysilicon film constitutes the channel region 111a of the TFT, which is perpendicular to the surface of silicon substrate 101. The channel current flows in the direction parallel to the surface of the silicon substrate 101. For easier understanding, in FIG. 3 shown schematically in plan, the p+source and drain regions 115, 116 are marked with left-low hatching and the channel region 111a with right-low hatching.

Letting the gate length of the TFT, which is the longitudinal dimension of ridge 112a covered with gate electrode 114, be, for example, about 1.2 μm, then the overlaps of gate electrode 114 over p+-type source and drain regions 115, 116, respectively, are 0.2 μm, respectively, consequently the channel length of the TFT (the length of channel region 111a) being about 0.8 μm. As shown in FIG. 3 and FIG. 4, the channel regions 111a are formed at both sides of the ridge 112. The channel width of each of the channel regions 111a is equal to the height of the ridge 112. Therefore, the total channel width of the TFT is twice the height of the ridge 112, and is about 0.2 μm. Thus a TFT of which the channel width is smaller than the minimum processible size is obtained can be improved with respect to channel width. Herein respective channel regions 111a are formed on each side face of ridge 112a. If formation of channel region is carried out on one side face only, the channel width of about 0.1 μm is obtained.

The TFT of the first embodiment above-described has an effect that the size of it can easily become smaller with narrower width of the channel without decreasing the channel length. Further owing to this, it becomes easy to prevent the short channel effect, with the result of enabling the off-leak current to reduce. Besides it is possible to increase the channel width by changing the height of ridge 112a without increasing plane area.

In the first embodiment described above, a p+-type silicon substrate is used as the semiconductor substrate, and polysilicon film as the semiconductor film. These however are not to be considered as limiting but any other semiconductor materials may be used as the semiconductor substrate and semiconductor film.

Figure 5A:
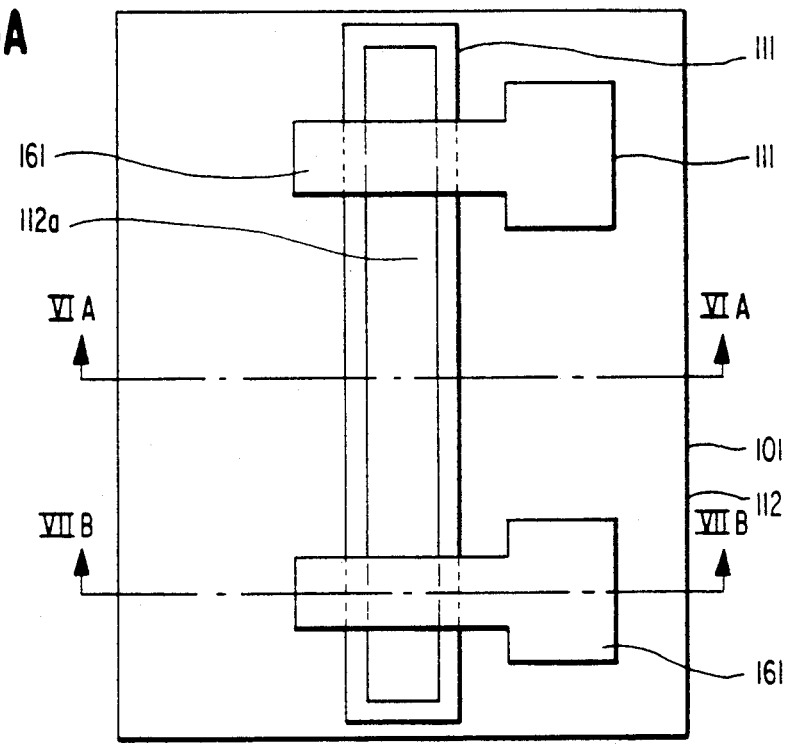
FIGS. 5A and 5B are schematic plan views illustrating the extracted steps from the process of fabricating the first embodiment.
Figure 5B:
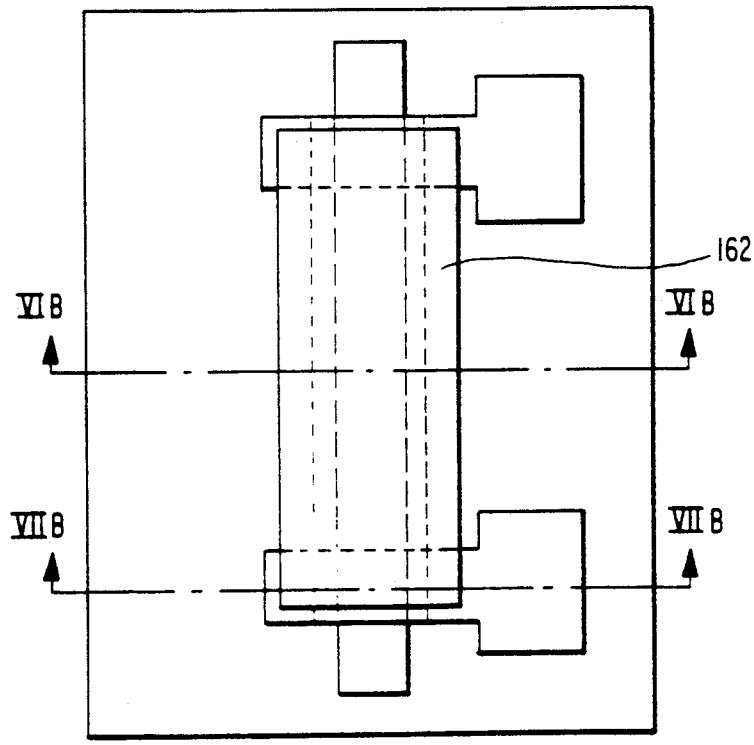
Figure 6A:
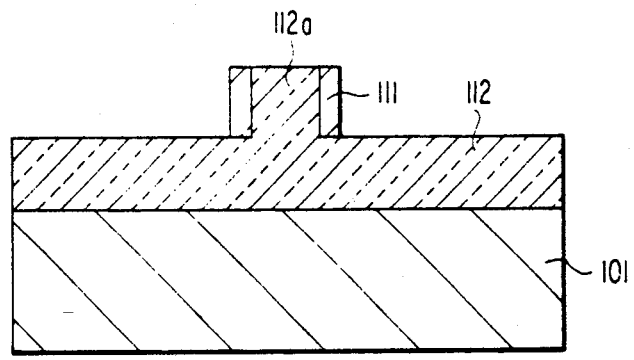
FIGS. 6A and 6B are schematic cross-sectional views taken along line A—A of FIG. 5A and line A—A of FIG. 5B for illustrating the extracted steps from the process of fabricating the first embodiment.
Figure 6B:
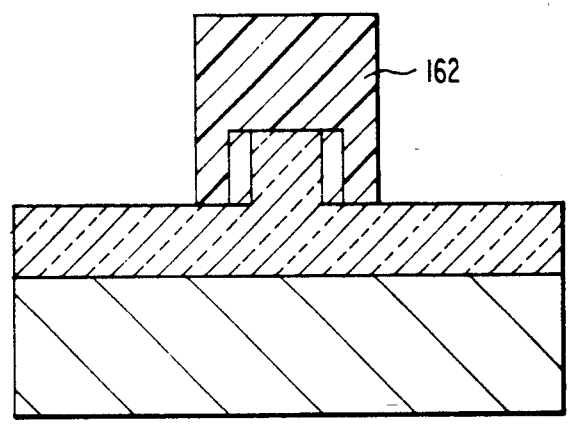
Figure 7A:
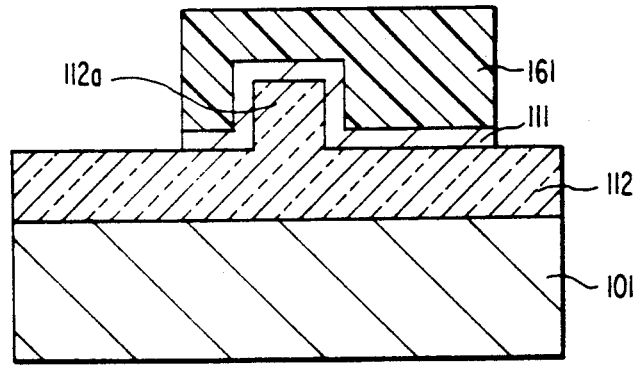
FIGS. 7A and 7B are schematic cross-sectional views taken along line B—B of FIG. 5A and line B—B of FIG. 5B, respectively, for illustrating the extracted steps from the process of fabricating the first embodiment.
Figure 7B:
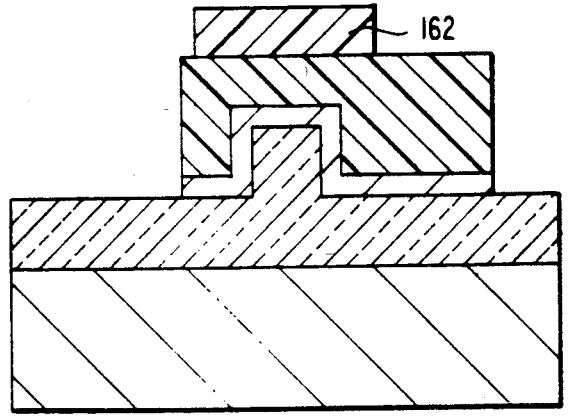

Referring to FIGS. 5A and 5B, FIGS. 6A and 6B, and FIGS. 7A and 7B, the procedure of forming the polysilicon film for making the semiconductor device of the first embodiment will be described under. FIGS. 5A and 5B are schematic plans of extracted steps from the process of fabricating the semiconductor device, FIGS. 6A and 6B are schematic cross-sections taken along line A—A in FIG. 5A and line A—A, respectively, of FIG. 5B, and FIGS. 7A and 7B are schematic cross-sections taken along line B—B in FIG. 5A and line A—A, respectively, of FIG. 5B.

Firstly over a p+-type silicon substrate 101 is formed a field oxide film 112 with a ridge 112, in turn, over the whole surface of which, non-crystalline silicon is deposited to form a film of about 30 to 50 nm thick. The non-crystalline silicon film is subjected to ion implantation of n-type impurity into it, followed by thermal treatment at 600° C., thus a n-type polysilicon film 111 being obtained. Then a negative resist 161 for defining source and drain regions 115, 116 (FIG. 3), respectively, is formed on the top face of field oxide film 112 including ridge 112a. By subsequent anisotropic dry etching, polysilicon film 111 is removed leaving the parts of it on the sides of ridge 112 and the parts of it just underneath resist 161 (FIGS. 5A, 6A, 7A).

In the next step, while resist 161 comprising the two areas remains unremoved, a positive resist 162 for defining a area extending between both areas is formed to cover the area. Then the remaining polysilicon film 111 is etched away by isotropic etching, leaving the parts covered with resists 161, 162 (FIGS. 5B, 6B, and 7B).

In the next step, after removing resists 161, 162, a gate oxide film 113a is formed. Then the conversion gate electrode 114 into p+-type and the formation of both p+-type source and drain regions 115, 116 and n-type channel region 111a are simultaneously carried out, thus the semiconductor device of the structure illustrated in FIGS. 3, 4A, 4B, 4C being obtained.

In the first embodiment described above the TFT is formed depending on the ridge of the field oxide film. This is not be considered as limiting but any other ridge can be used.

The second embodiment of the present invention will be set forth with reference to FIGS. 8A through 8C which are schematic cross-sections for illustrating at stages the process of fabricating a semiconductor device of the second embodiment hereinafter.

Firstly in the known procedure at the surface of a p-type silicon substrate 101 are formed a LOCOS-type silicon oxide 102, and a gate oxide film 103. Then a gate electrode 104, about 0.2 μm in thickness, of n+-type polysilicon, and n+-type source and drain regions 105, 106 are formed. Thus a n-channel MOS transistor is built at the surface of p+-type silicon substrate 101.

Figure 8A:
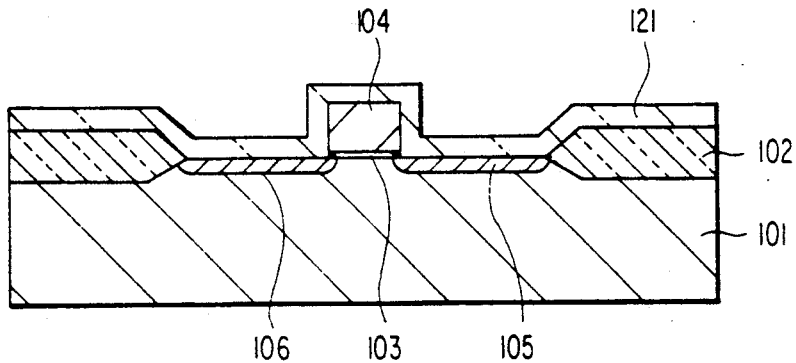
FIGS. 8A through 8C are schematic cross-sectional views illustrating the second embodiment stepwise from the viewpoint of the fabricating process.
Figure 8B:
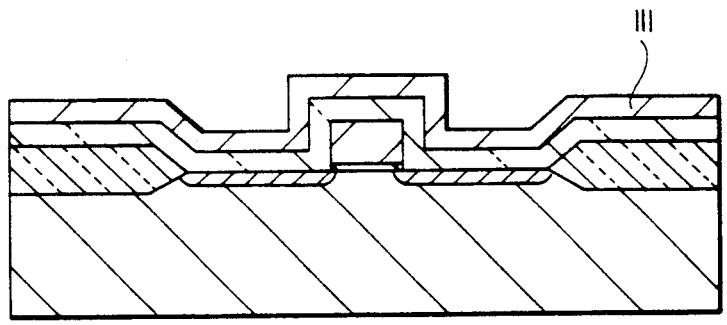
Figure 8C:
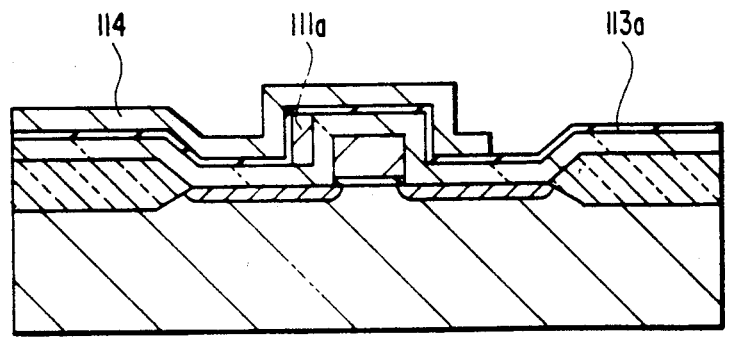

Subsequently over the whole surface an insulating film 121 of about 100 to 200 nm thick is deposited (FIG. 8A). The insulating film 121 is formed by the low pressure or high-temperature chamical vapor deposition technique which can provide good stepped coating.

In the next step, in the same way as in the first embodiment described above, a n+-type polysilicon film 111 of about 30 to 50 nm thick is formed over the whole surface (FIG. 8B), and etched. Then a gate oxide film 113a, a p+-type gate electrode 114 of polysilicon, p+-type source and drain regions (not shown), and channel region 111a (FIG. 8C) are formed, thus a TFT being made.

The TFT of the second embodiment described above is of p-channel type. In the second embodiment, different from the first embodiment, gate electrode 104 of the n-channel MOS transistor made at the surface of the silicon substrate takes the place of the ridge in the first embodiment. This TFT is provided only on one side face (the side were n+-type drain region 106 is formed) with a channel region 111a the width of which is 0.2 μm equal to the height of gate electrode 104. The n+-type source region 105 of n-channel MOS transistor is supplied with low potential. For this reason, if the channel region 111a of the TFT would be located above the n+-type source region 105 of n-channel MOS transistor, the operation of the TFT would be influenced by the low potential to increase a leak current flowing through the channel region 111a. Therefore, the channel region 111a is located above the drain region 106. The TFT of the second embodiment has the same advantage as the TFT of the first embodiment does.

Figure 10:
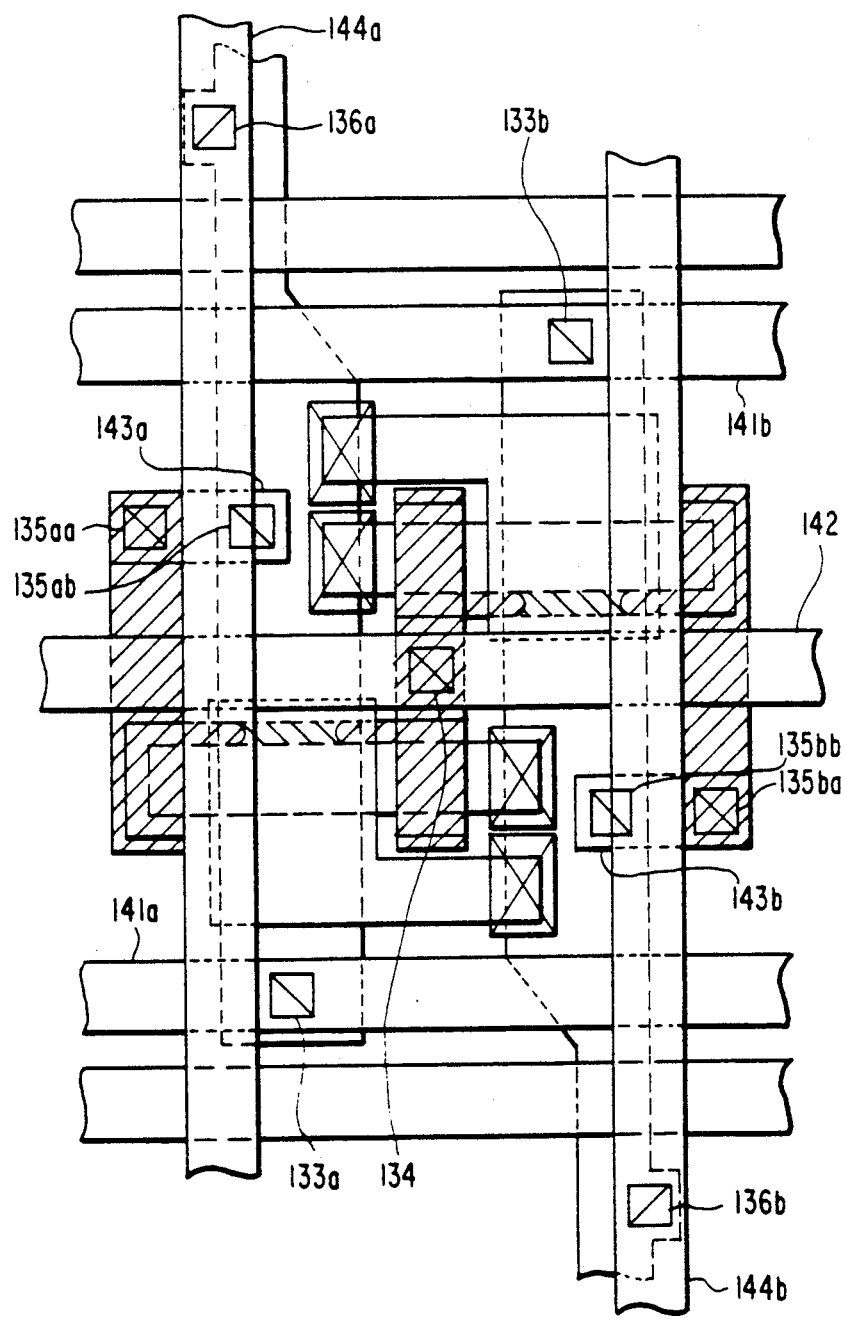
FIG. 10 is a schematic plan view of a memory cell of a SRAM to which the second embodiment is applied.

Referring to FIGS. 9 and 10, schematic plans each at intermediate and finished stages, respectively, of the process of making a memory cell of a SRAM, an application of the second embodiment to a SRAM will be described below. This SRAM is one described in Japanese Patent Laid-Open Application No. Hei. 3-114256, and its memory cell is point-symmetrical.

Firstly over the surface of a p-type silicon substrate (not shown) are formed a silicon oxide film 102, a gate oxide film (not shown) for n-channel MOS transistor, gate electrodes 104a, 104b, about 0.2 μm thick, of n+-type polysilicon, and a word line 104c. By ion implantation using gate electrodes 104a, 104b, and word line 104c as masks, n+-type source regions 105a, 105b, n+-type drain regions 106a, 106b, etc. are formed. Thus the first drive transistor consisting of gate electrode 104a and n+-type source and drain regions 105a, 106a; the second drive transistor consisting of gate electrode 104b and n+-type source and drain regions 105b, 106b; the first transfer transistor comprising word line 104c, n+-type drain region 106a, and n+-type source region; and the second transfer transistor comprising word line 104c, n+-type drain region 106b, and n+-type source region are produced. The respective gate lengths of the first and second drive transistors are about 0.5 μm, and the respective gate widths of them are about 1.0 μm. The respective gate lengths of the first and second transfer transistors are about 0.5 μm, and the respective gate widths of them are about 0.5 μm. Gate electrode 104a is connected via a direct contact hole 131b to n+-type drain region 106b, and gate electrode 104b is connected via a direct contact hole 131a to n+-type drain region 106a.

In the next step, an insulating film (not shown) of about 200 nm thick is deposited over the whole surface, and then in the same way as described above, channel regions 111aa, 111ab, about 30-50 nm thick, of polysilicon film, a p+-type source region 115, p+-type drain regions 116a, 116b, a TFT gate-oxide film (not shown), and gate electrodes 114a, 114b of p+-type polysilicon are formed. The p-channel TFT constituting the first load transistor consists of the TFT gate-oxide film, gate electrode 114a, channel region 111aa, and p+-type source and drain region 115, 116a. Similarly the p-channel TFT constituting the second load transistor consists of the TFT gate-oxide film, a gate electrode 114b, a channel region 111ab, and p+-type source and drain regions 115, 116b. The gate lengths of the first and second load transistors are about 1.2 μm, respectively, and the respective gate widths of them are about 0.8 μm. The channel widths of these load transistors are about 0.2 μm, respectively. Gate electrode 114a is connected via a direct contact hole 132b to n+-type drain region 106b, and gate electrode 114b via a direct contact hole 132a to n+-type drain region 106a (FIG. 9).

Besides pn junctions are formed at direct contact holes 132a, 132b, respectively. They however are out of question with respect to SRAM because the electric current flows via direct contact holes 132a, 132b forwardly to the pn junctions. When gate electrodes 114a, 114b are made from n+-type polysilicon, silicide, or the like, no such pn junction is formed, and in accordance with this the concentrations of n+-type impurity in channel regions 111aa, 111ab are necessary to be adjusted.

In the next step, over the whole surface is formed the first interlayer insulating film (not shown), in which contact holes 133a, 133b, 134, 135aa, 135ab, 135ba, and 135bb are formed. Then the first-layer aluminium connections: ground connections 141a, 141b, power supply connection 142, and connections 143a, 143b are formed. Ground connections 141a, 141b are connected via contact holes 133a, 133b, respectively, to n+-type source regions 105a, 105b, respectively. Power supply connection 142 is connected via a contact hole 134 to p+-type source region 115. p+-type drain region 116a is connected via a contact hole 135aa, connection 143a, and contact hole 135ab to n+-type drain region 106a. Similarly p+-type drain region 116b is connected via contact hole 135ba, connection 143b, and contact hole 135bb to n+-type drain region 106b.

In the next step, after the second interlayer insulating film (not shown) is formed over the whole surface, contact holes 136a, 136b are formed in the first and second interlayer insulating films. Then a pair of bit lines 144a, 144b which is the second layer interconnection of aluminium is formed. Bit line 144a is connected via contact hole 136a to n+-type source region of the first transfer transistor. Likewise bit line 144b is connected via contact hole 136b to the n+-type source region of the second transfer transistor (FIG. 10). Thus the memory cell of SRAM to which the second embodiment is applied has been completed.

This SRAM has the effects of the second embodiment stated above. It also is superior in high speed operation as its additional effect because there is in it little overlap of the source and drain regions of the p-channel TFT over those of the drive transistor consisting of n-channel MOS transistor, reflecting a low coupling capacity.

Figure 11:
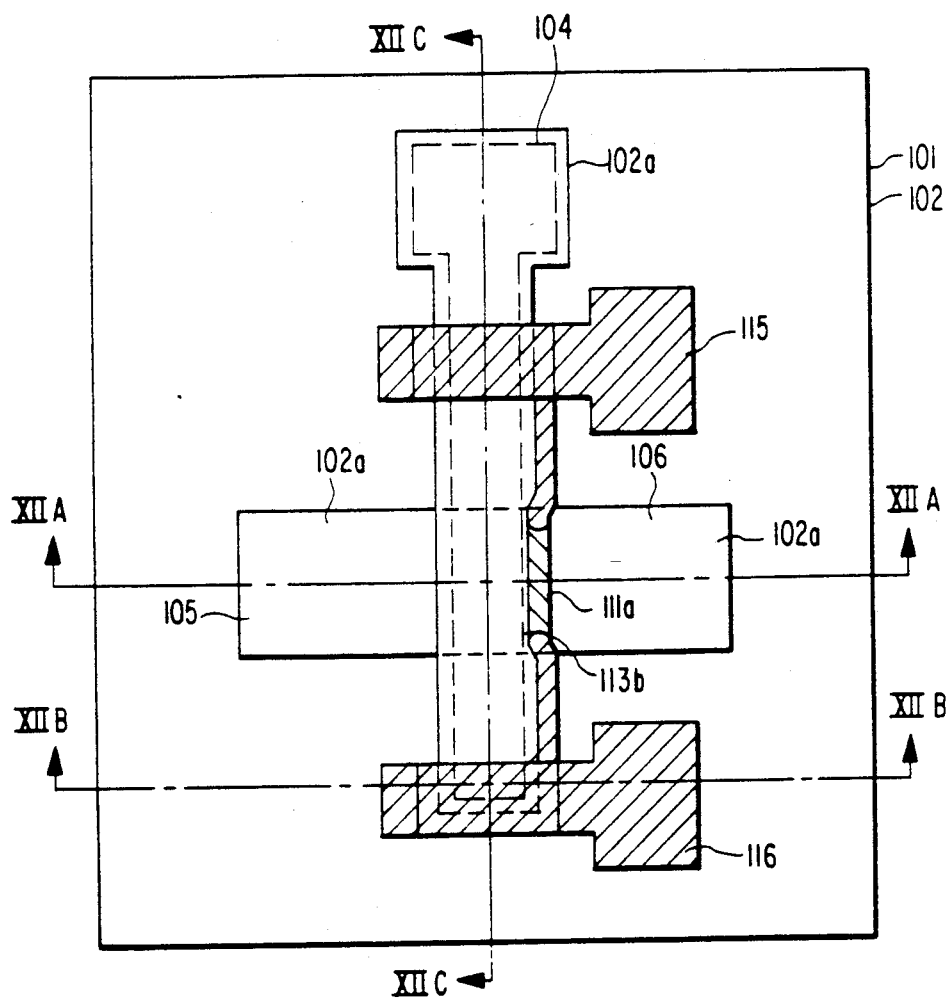
FIG. 11 is schematic plan view illustrating the third embodiment.
Figure 12A:
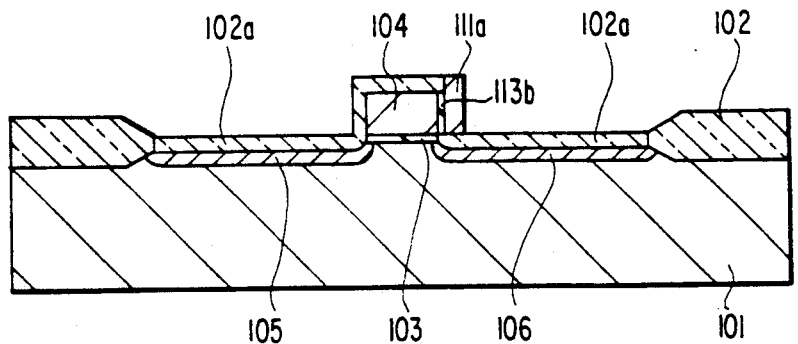
FIGS. 12A through 12C are schematic cross-sectional views taken along lines A—A, B—B, and C—C of FIG. 11 for illustrating the third embodiment.
Figure 12B:
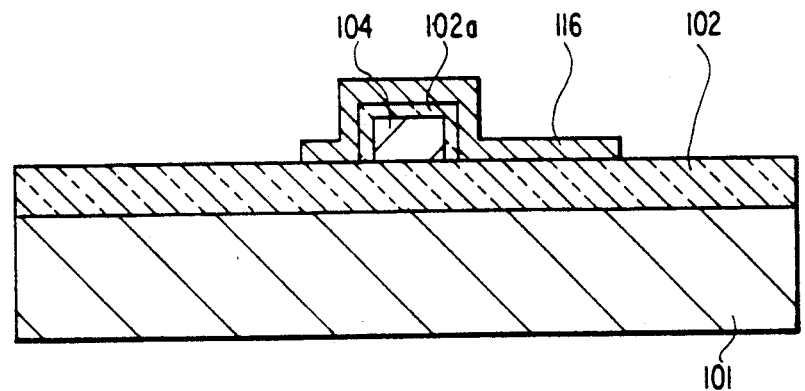
Figure 12C:
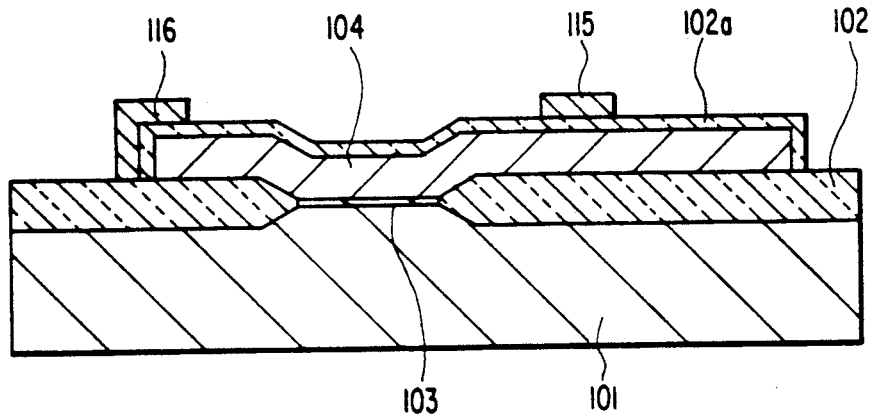

The third embodiment of the present invention will be described below with reference to FIG. 11, a schematic plan of the semiconductor device of it, and FIGS. 12A, 12B and 12C, schematic cross-sections taken along lines A—A, B—B, and line C—C, respectively, of FIG.

11. This embodiment is a semiconductor device having a p-channel TFT constructed as described in the following. Over a p+-type silicon substrate 101 is formed a n-channel MOS transistor which comprises a LOCOS-type silicon oxide film 102 and a gate oxide film 103 at the surface of silicon substrate 101, a gate electrode 104, about 0.2 μm thick, of n+-type polysilicon on gate oxide film 103, and n+-type source and drain regions 105, 106 in self-alignment with gate electrode 104 at the surface of silicon substrate 101. The gate length and gate width of this n-channel type MOS transistor are about 0.5 μm and about 1.0 μm, respectively.

A gate oxide film 113b is formed on the side face of gate electrode 104, on the side of n+-type drain region 106. A LOCOS-type silicon oxide film 102a of 200 nm thick is formed on the top faces of n+-type source and drain regions 105, 106, and gate electrode 104, and on the side face of gate electrode 104 except where gate oxide film 113b is formed. A channel region 111a, 30 to 50 nm thick, of polysilicon film is provided through the intermediation of gate oxide 113b on the side face of gate electrode 104. On the respective specified areas in silicon oxide films 102a, 102 are formed each of p+-type source and drain regions 115, 116, 30 to 50 nm thick, of polysilicon film in such a way that channel region 111a may interconnect between them. In this embodiment, gate electrode 104 of the above-mentioned n-channel MOS transistor is also used as the gate electrode of the p-channel TFT. In other words the p-channel TFT consists of gate electrode 104, gate oxide film 113b, channel region 111a, and p+-type source and drain regions 115, 116. The gate length and channel length of the TFT are about 0.8 μm and about 0.6 μm, respectively, and the channel width of it is about 0.2 μm.

Besides gate oxide film 113b may be provided on the other side face of gate electrode 104 then above-mentioned. In this case it is necessary to take the overlap of the source and drain regions of the TFT over those of the n-channel MOS transistor into consideration.

In the third embodiment, channel region 111a, and p+-type source and drain regions 115, 116 are of polysilicon film which is formed in the same way as the first embodiment. Gate electrode 104 of this TFT is of n+-type, and hence the corresponding value to this is necessary to be set as the concentration of p-type impurity in channel region 111a. This embodiment has the effects of the first and second embodiments. Further p+-type source and drain regions 115, 116 are formed by ion implantation using a resist (not shown) as mask, and thereby p+-type drain region of offset structure is readily formed, which in turn makes it easier to reduce off-leak current involving this TFT compared with the first and second embodiments.

Figure 13A:
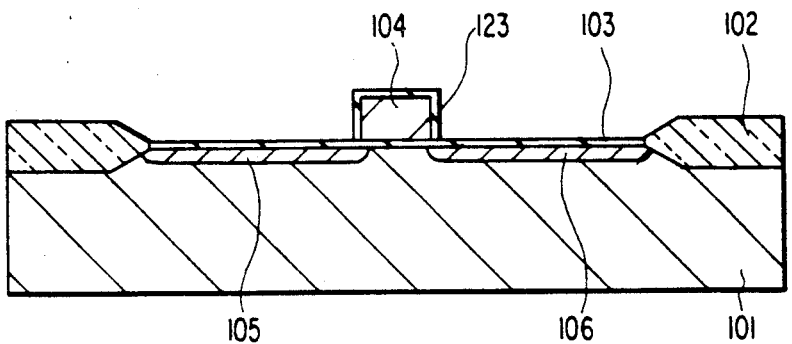
FIGS. 13A through 13C are schematic cross-sectional views taken along line A—A of FIG. 11 for illustrating the extracted steps from the process of fabricating the third embodiment.
Figure 13B:
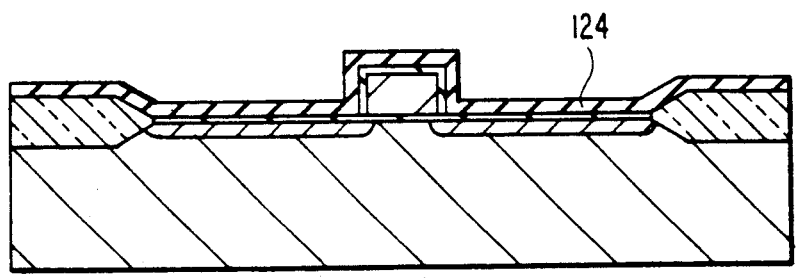
Figure 13C:
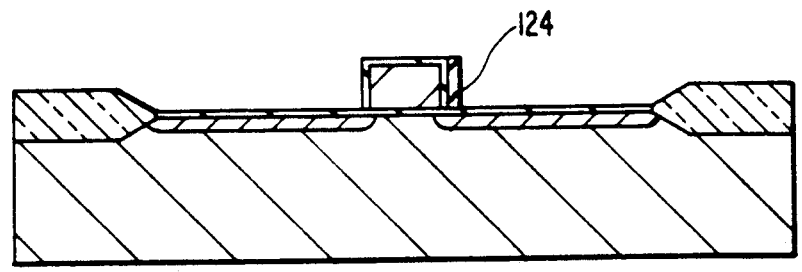

In the following the procedure of forming gate oxide film 113b in the third embodiment will be described with reference to FIGS. 13A through 13C giving schematic cross-sections for illustrating at stages the process of fabricating the semiconductor device of this embodiment.

Firstly, as in the known procedure, at the surface of p-type silicon substrate 101 are formed a LOCOS-type silicon oxide 102, and a gate oxide film 103. Then a gate electrode 104, about 0.2 μm in thickness, of n+-type polysilicon, and n+-type source and drain regions 105, 106 are formed. Thus a n-channel MOS transistor is made at the surface of p+-type silicon substrate 101. Then a silicon oxide film 123 of 10 to 20 nm thick is formed by thermal oxidation on the top and side faces, respectively, of the gate electrode (FIG. 13A). Then over the whole surface an silicon nitride film 124 of about 100 nm thick is deposited (FIG. 13B) and subjected to anisotropic dry etching to remain only on side faces of gate electrode 104. The side face of gate electrode 104 just above n+-type drain region 106 is covered with a resist (not shown), and then isotropic etching is carried out, leaving the covered area of silicon nitride film 124 (FIG. 13C).

After removing the resist, selective oxidation is carried out using the last remaining silicon nitride film 124 as mask to form silicon oxide film 102a. After removing the silicon nitride film 124 and silicon oxide film 123, thermal oxidation is carried out, thus gate oxide film 113b being formed on the side face of gate electrode 104 just above n+-type drain region 106 (See FIGS. 11 and 12A).

Figure 14:
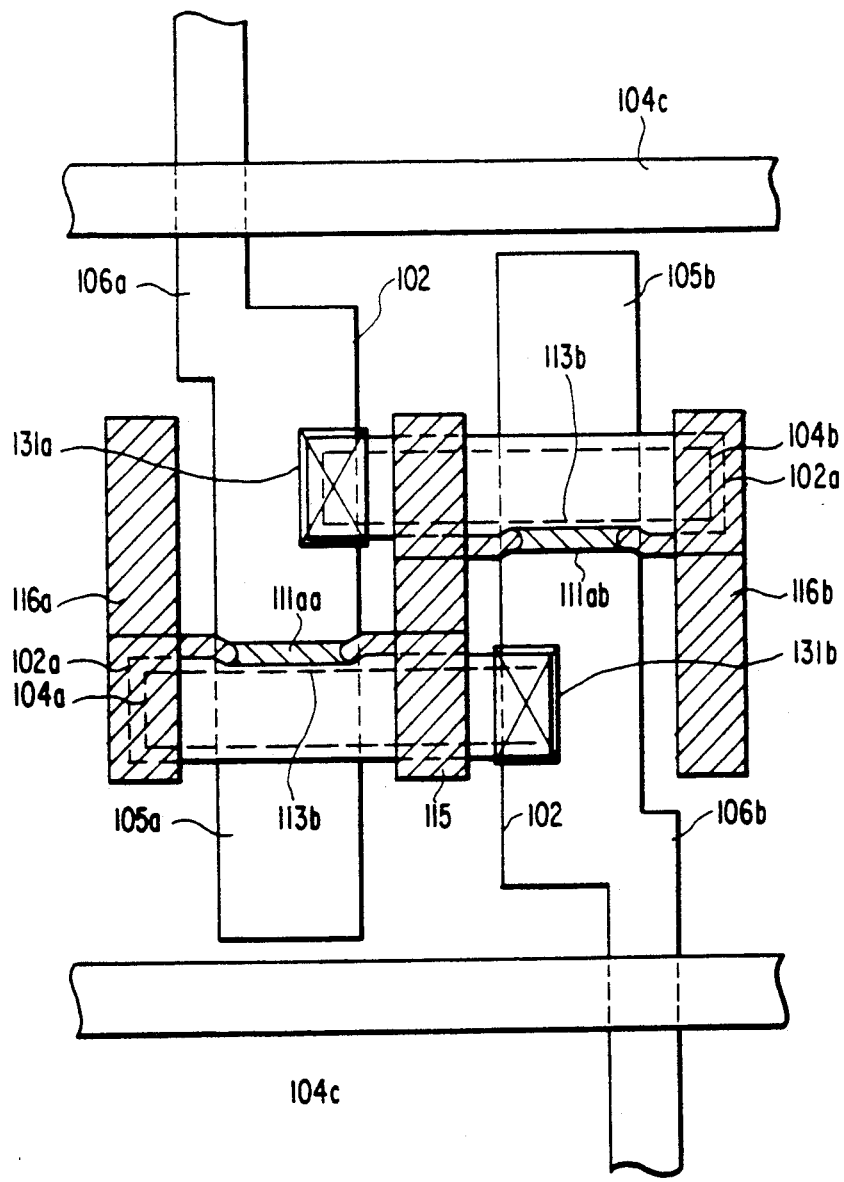
FIG. 14 is schematic plan view of a memory cell of a SRAM to which the third embodiment is applied, in the way of the process of fabricating it.
Figure 15:
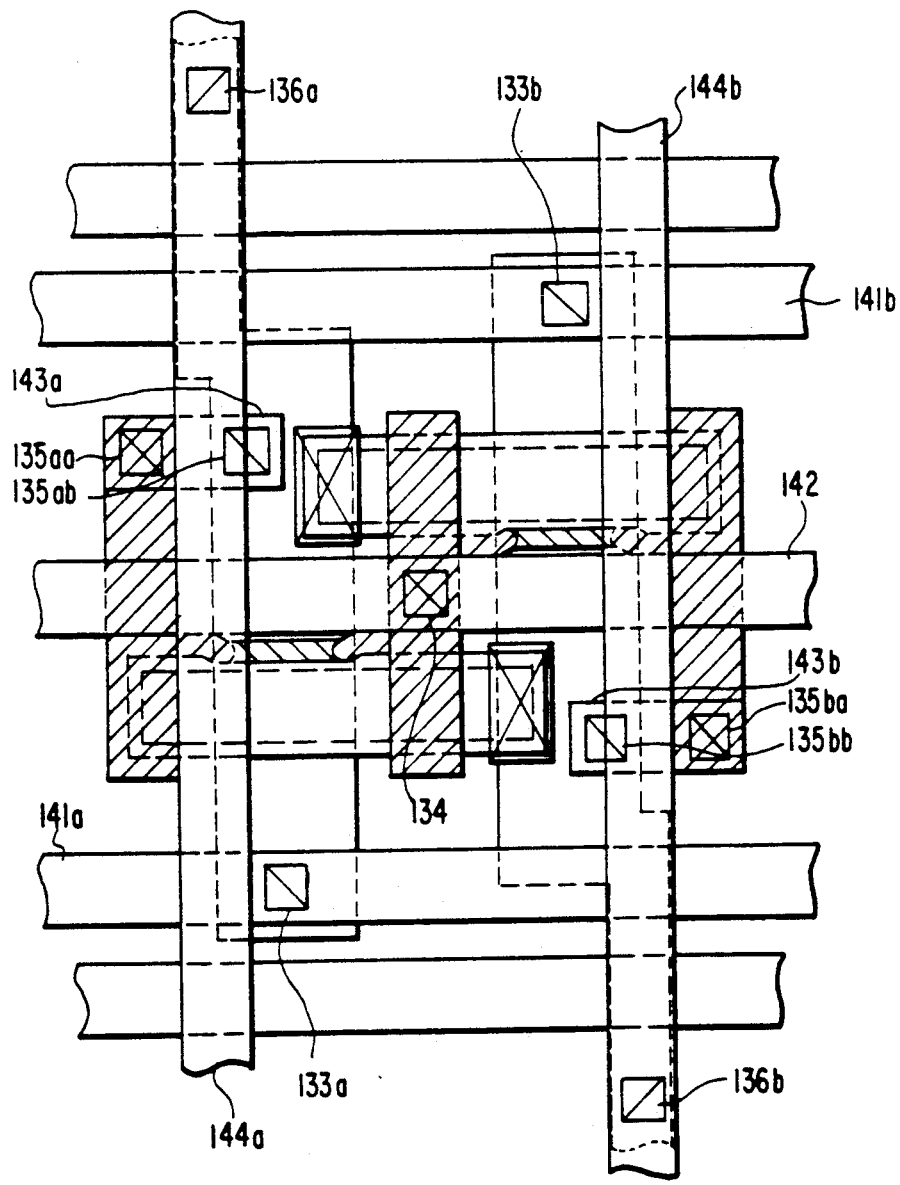
FIG. 15 is a schematic plan view of a memory cell of a SRAM to which the third embodiment is applied.

Referring to FIGS. 14 and 15, schematic plans each at intermediate and finished stages, respectively, of the process of making a memory cell of a SRAM, an application of the third embodiment to a SRAM will be described below.

Firstly over the surface of p-type silicon substrate (not shown) are formed a silicon oxide film 102, a gate oxide film (not shown) for n-channel MOS transistor, gate electrodes 104a, 104b, about 0.2 μm thick, of n+-type polysilicon, and a word line 104c. By ion implantation using gate electrodes 104a, 104b, and word line 104c as masks, n+-type source regions 105a, 105b, n+-type drain regions 106a, 106b, etc. are formed. Thus the first drive transistor consisting of gate electrode 104a and n+-type source and drain regions 105a, 106a; the second drive transistor consisting of gate electrode 104b and n+-type source and drain regions 105b, 106b; the first transfer transistor comprising word line 104c, n+-type drain region 106a, and n+-type source region; and the second transfer transistor comprising word line 104c, n+-type drain region 106b, and n+-type source region are produced. The respective gate lengths of the first and second drive transistors are about 0.5 μm, and the respective gate widths of them are about 1.0 μm. The respective gate lengths of the first and second transfer transistors are about 0.5 μm, and the respective gate widths of them are about 0.5 μm. Gate electrode 104a is connected via a direct contact hole 131b to n+-type drain region 106b, and gate electrode 104b is connected via a direct contact hole 131a to n+-type drain region 106a.

In the next step, after making a silicon oxide film 102a and a gate oxide film 113b, then channel regions 111aa, 111ab, about 30-50 nm thick, of polysilicon film, a p+-type source region 115, p+-type drain regions 116a, 116b are formed. The p-channel TFT constituting the first load transistor consists of the gate-oxide film 113b, gate electrode 104, channel region 111aa, and p+-type source and drain regions 115, 116a. Similarly the p-channel TFT constituting the second load transistor consists of a gate-oxide film 113b, a gate electrode 104b, a channel region 111ab, and p+-type source and drain regions 115, 116b. The gate lengths of the first and second load transistors are about 0.8 μm, respectively, and the respective channel length of them are about 0.4 μm. The channel widths of the two load transistors are about 0.2 μm, respectively (FIG. 14).

In the next step, over the whole surface is formed the first interlayer insulating film (not shown), in which contact holes 133a, 133b, 134, 135aa, 135ab, 135ba, and 135bb are formed. Then the first-layer aluminium connections: ground connections 141a, 141b, power supply connection 142, and connections 143a, 143b are formed. Ground connections 141a, 141b are connected via contact holes 133a, 133b, respectively, to n+-type source regions 105a, 105b, respectively. Power supply connection 142 is connected via a contact hole 134 to p+-type source region 115. p+-type drain region 116a is connected via a contact hole 135aa, connection 143a, and contact hole 135ab to n+-type drain region 106a. Similarly p+-type drain region 116b is connected via contact hole 135ba, connection 143b, and contact hole 135bb to n+-type drain region 106b.

In the next step, after the second interlayer insulating film (not shown) is formed over the whole surface, contact holes 136a, 136b are formed in the first and second interlayer insulating films. Then a pair of bit lines 144a, 144b which is the second layer interconnection of aluminium is formed. Bit line 144a is connected via contact hole 136a to n+-type source region of the first transfer transistor. Likewise bit line 144b is connected via contact hole 136b to the n+type source region of the second transfer transistor (FIG. 15). Thus the memory cell of SRAM to which the second embodiment is applied has been completed.

This SRAM has the effects of the third embodiment and of the SRAM to which the second embodiment is applied. It has further effect that because of the common use of one gate electrode to the p-channel TFT and the n-channel MOS transistor, smaller memory cell can be obtained than that of the SRAM to which the second embodiment is applied.

Although the invention has been described with reference to specific embodiments, this description is not meant to be construed in a limiting sense. Various modifications of the disclosed embodiments, as well as other embodiments of the invention, will become apparent to persons skilled in the art upon reference to the description of the invention. It is therefore contemplated that the appended claims will cover any modifications or embodiments as fall within the true scope of the invention.

What is claimed is:

1. A semiconductor device comprising:
   an insulating film formed over a semiconductor substrate, said insulating film including a ridge which has first and second side walls, each of said side walls having a first longitudinal part, a second longitudinal part and a third longitudinal part therebetween;
   first and second semiconductor thin films formed on said first and second side walls, respectively, each of said first and second semiconductor thin films including a first area formed on and extended across said first longitudinal part of an associated one of said first and second side walls, a second area formed on and extended across said second longitudinal part of said associated one of said first and second side walls and a third area formed on said third longitudinal part of said associated one of said first and second side walls to interconnect said first and second areas to each other; and
   a thin film transistor comprising a source region composed of the first longitudinal parts of said first and second semiconductor thin films, a drain region composed of the second longitudinal parts of said first and second semiconductor thin films, and a channel region composed of the third longitudinal parts of said first and second semiconductor thin films.

2. A semiconductor device comprising:
   an insulating film formed over a semiconductor substrate with a projection;
   a semiconductor thin film consisting of a first area formed on said insulating film and extending across a longitudinal part of said projection, a second area formed on said insulating film and extending across another longitudinal part of said projection distant from said first area, and a third area formed on said insulating film and extending alongside at least one side face of said projection to interconnect said first and second areas to each other; and
   a thin film transistor comprising said first, second and third areas as source, drain and channel regions, respectively;
   wherein said semiconductor substrate is a silicon substrate, and a gate electrode of a MOS transistor formed in said projection and at a surface of said silicon substrate.

3. A semiconductor device according to claim 2 wherein
   said thin film transistor comprises a gate insulating film formed over said semiconductor film, and a gate electrode of said thin film transistor formed on said gate insulating film.

4. A semiconductor device according to claim 3, wherein said semiconductor device is a SRAM;
   said silicon substrate is a p-type silicon substrate;
   said MOS transistor is a drive transistor consisting of a n-channel MOS transistor;
   said semiconductor film is of polysilicon; and
   said thin film transistor is a load element consisting of a p-channel thin film transistor.

5. A semiconductor device comprising:
   an insulating film formed over a semiconductor substrate with a projection;
   a semiconductor thin film consisting of a first area formed on said insulating film and extending across a longitudinal part of said projection, a second area formed on said insulating film and extending across another longitudinal part of said projection distant from said first area, and a third area formed on said insulating film and extending alongside at least one side face of said projection to interconnect said first and second areas to each other; and
   a thin film transistor comprising said first, second and third areas as source, drain and channel regions, respectively;
   wherein said semiconductor substrate is a silicon substrate, a gate electrode of a MOS transistor formed in said projection and at a surface of said silicon substrate, said gate electrode of said MOS transistor is a common gate electrode used also as a gate electrode of said thin film transistor, and said insulating film between said third area of said semiconductor thin film and the gate electrode of said MOS transistor serves also as a gate insulating film of said thin film transistor.

6. A semiconductor device according to claim 5, wherein said semiconductor device is a SRAM;
   said silicon substrate is a p-type silicon substrate;
   said MOS transistor is a drive transistor consisting of an n-channel MOS transistor;
   said semiconductor film is of polysilicon; and
   said thin film transistor is a load element consisting of a p-channel thin film transistor.

7. A semiconductor device comprising:

a substrate; a first insulating layer formed on said substrate; a projection member having a side wall substantially perpendicular to said first insulating layer; a second insulating layer formed on said side wall of said projection member; a semiconductor layer covering said side wall of said projection member; and a first field effect transistor having source and drain regions formed in said semiconductor layer and a channel region having a width substantially equal to a width of said second insulating layer in the direction perpendicular to a major surface of said first insulating film, wherein said substrate is a semiconductor substrate formed beneath said first insulating layer and a second field effect transistor having source and drain regions formed in said semiconductor substrate and a gate electrode of said first and second field effect transistors formed in said projection member.

8. The semiconductor device as claimed in claim 7, wherein said first field effect transistor is formed over said drain region of said second field effect transistor.

* * * * *

UNITED STATES PATENT AND TRADEMARK OFFICE
CERTIFICATE OF CORRECTION

PATENT NO. : 5,309,010
DATED : May 3, 1994
INVENTOR(S) : Hiroshi Kitajima

It is certified that error appears in the above-indentified patent and that said Letters Patent is hereby corrected as shown below:

Column 6, lines 35-36, delete "which ion implantation of p-type impurity is made in the".

Column 9, line 4, delete "chamical" and insert --chemical --.

Signed and Sealed this

Eighth Day of November, 1994

Attest:

BRUCE LEHMAN

*Attesting Officer*  *Commissioner of Patents and Trademarks*